(12) United States Patent
Maniscalco et al.

(10) Patent No.: US 10,686,126 B2
(45) Date of Patent: Jun. 16, 2020

(54) BACK END OF LINE METALLIZATION STRUCTURES

(71) Applicant: International Business Machines Corporation, Armonk, NY (US)

(72) Inventors: Joseph F. Maniscalco, Lake Katrine, NY (US); Raghuveer R. Patlolla, Guilderland, NY (US); Cornelius Brown Peethala, Slingerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/681,981

(22) Filed: Nov. 13, 2019

(65) Prior Publication Data

US 2020/0083435 A1 Mar. 12, 2020

Related U.S. Application Data

(62) Division of application No. 16/017,417, filed on Jun. 25, 2018.

(51) Int. Cl.
*H01L 21/768* (2006.01)
*H01L 43/02* (2006.01)
(Continued)

(52) U.S. Cl.
CPC ......... *H01L 43/02* (2013.01); *H01F 10/3254* (2013.01); *H01L 21/7684* (2013.01); *H01L 21/76802* (2013.01); *H01L 21/76831* (2013.01); *H01L 21/76843* (2013.01); *H01L 21/76877* (2013.01); *H01L 23/528* (2013.01);
(Continued)

(58) Field of Classification Search
CPC ........... H01L 21/7684; H01L 21/76852; H01L 21/76883; H01L 23/5226
See application file for complete search history.

(56) References Cited

U.S. PATENT DOCUMENTS 6,274,499 B1 * 8/2001 Gupta ............... H01L 21/76801
257/E21.304
6,582,579 B1 6/2003 Uzoh
(Continued)

OTHER PUBLICATIONS

Joseph F. Maniscalco et al. "Back End of Line Metallization Structures", U.S. Appl. No. 16/017,417, filed Jun. 25, 2018.
(Continued)

*Primary Examiner* — George R Fourson, III
(74) *Attorney, Agent, or Firm* — Cantor Colburn LLP; Vazken Alexanian

(57) ABSTRACT

Back end of line (BEOL) metallization structures and methods according to aspects of the invention generally include forming an interconnect structure including a recessed via structure in an interlayer dielectric. The recessed via structure is lined with a liner layer and filled with a first metal such as copper, tungsten, aluminum, alloys thereof or mixtures thereof. The recessed portion is filled with a second metal such as tantalum, titanium, tungsten, cobalt, ruthenium, iridium, platinum, nitrides thereof, or mixtures thereof, which in combination with the liner layer provides effective barrier properties for the bulk first metal.

9 Claims, 5 Drawing Sheets

(51) Int. Cl.
*H01L 43/12* (2006.01)
*H01L 27/22* (2006.01)
*H01L 23/522* (2006.01)
*H01F 10/32* (2006.01)
*H01L 23/528* (2006.01)
*H01L 23/532* (2006.01)

(52) U.S. Cl.
CPC ........ *H01L 23/5226* (2013.01); *H01L 27/222* (2013.01); *H01L 43/12* (2013.01); *H01L 23/53238* (2013.01)

(56) References Cited

U.S. PATENT DOCUMENTS

| | | | |
|---|---|---|---|
| 8,866,242 B2 | 10/2014 | Li et al. | |
| 9,691,971 B2 | 6/2017 | Nam et al. | |
| 9,865,800 B2 | 1/2018 | Han et al. | |
| 9,881,833 B1 | 1/2018 | Briggs et al. | |
| 2002/0068431 A1 | 6/2002 | Petrarca et al. | |
| 2004/0248407 A1* | 12/2004 | Liu | H01L 21/288 438/642 |
| 2006/0172527 A1* | 8/2006 | Marxsen | H01L 21/3212 438/633 |
| 2007/0007653 A1 | 1/2007 | Chen et al. | |
| 2007/0018332 A1 | 1/2007 | Ueno | |
| 2007/0049008 A1* | 3/2007 | Martin | H01L 21/7684 438/626 |
| 2014/0209563 A1 | 7/2014 | Zhang et al. | |
| 2015/0200355 A1 | 7/2015 | Erie et al. | |
| 2016/0043030 A1 | 1/2016 | Lu et al. | |
| 2016/0064648 A1 | 3/2016 | Tsubata et al. | |
| 2017/0053967 A1 | 2/2017 | Chuang et al. | |
| 2017/0352804 A1 | 12/2017 | Chuang et al. | |
| 2018/0040814 A1 | 2/2018 | Park | |
| 2019/0027537 A1 | 1/2019 | Wiegand et al. | |

OTHER PUBLICATIONS

List of IBM Patents or Patent Applications Treated as Related; (Appendix P), Date Filed Nov. 13, 2019; 2 pages.

Tetsuo Endoh, et al., "An Overview of Nonvilatile Emerging Memories-Spintronics for Working Memories," IEEE Journal on Emerging and Selected Topics in Circuits and Systems, vol. 6, No. 2. Jun. 2016 (pp. 109-119).

* cited by examiner

BACK END OF LINE METALLIZATION STRUCTURES

DOMESTIC PRIORITY

This application is a divisional of U.S. application Ser. No. 16/017,417 entitled "BACK END OF LINE METALLIZATION STRUCTURES," filed Jun. 25, 2018, incorporated herein by reference in its entirety.

BACKGROUND

The present invention generally relates to semiconductor integrated circuits, and more particularly, to a recessed via structure for back end of line metallization structures.

Integrated circuit processing can be generally divided into front end of the line (FEOL), middle of the line (MOL) and back end of the line (BEOL) metallization processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact (CA) formation. Layers of interconnections are formed above these logical and functional layers during the BEOL metallization processing to complete the integrated circuit structure. As such, BEOL metallization processing generally involves the formation of insulators and conductive wiring. Often, the BEOL metallization process can further include fabrication of magnetoresistive random access memory (MRAM) devices, capacitors, resistors and the like.

SUMMARY

Embodiments of the present invention are generally directed to semiconductor structures including back end of line (BEOL) metallization structures and methods of fabrication. A non-limiting example of the BEOL metallization structure according to one or more aspects of the present invention includes a first interconnect structure including an interlayer dielectric and one or more metal filled trenches therein. A second interconnect structure overlies the first interconnect structure and includes an interlayer dielectric including at least one via including a liner layer on a bottom surface of the via and on sidewalls extending from the bottom surface. A first metal is in the via having a recessed top surface below a plane defined by a top surface of the interlayer dielectric, and a second metal fills the recessed top surface. The first metal is different from the second metal and includes copper, tungsten, aluminum, alloys thereof or combinations thereof. The second metal includes tantalum, tungsten, titanium, cobalt, ruthenium, iridium, platinum, alloys thereof, or combinations thereof. A third interconnect structure overlies the second interconnect structure and includes an interlayer dielectric including a trench, wherein the via of the second interconnect structure is configured to provide a conductive pathway between the first and third interconnect structures.

A non-limiting example of the BEOL metallization fabrication method according to one or more aspects of the present invention includes forming a second interconnect structure by depositing a second interlayer dielectric onto a planar top surface of a first interconnect structure. The second interlayer dielectric is patterned to form at least one via opening to expose a surface of the first interconnect structure. A liner layer is conformally deposited onto the second interlayer dielectric. A first metal layer is deposited onto the liner layer, the first metal layer including copper, tungsten, aluminum, alloys thereof, or mixtures thereof. An overburden of the first metal layer is removed from the liner layer on the second interlayer dielectric by a first planarizing process. The first planarizing process is continued to form a recess in the via opening without removing the liner layer. A second metal layer different from the first metal layer is deposited so as to fill the recess with the second metal, wherein the second metal layer includes tantalum, titanium, tungsten, cobalt, ruthenium, iridium, rhodium, nitrides thereof, alloys thereof, or mixtures thereof. An overburden of the second metal layer and the liner layer immediately underlying the second metal layer is removed by a second planarizing process to define a second metal filled recessed via structure in the second interconnect structure, wherein the second interconnect structure has a planar top surface including the second metal filled recessed via structure.

A non-limiting example of the BEOL metallization fabrication method in accordance with one or more aspects of the present invention includes forming a second interconnect structure including a via structure by depositing a second interlayer dielectric onto a planar top surface of a first interconnect structure. The second interlayer dielectric is patterned to form a via opening and expose a surface of the first interconnect structure. A liner layer is conformally deposited onto the second interlayer dielectric and a first metal layer is deposited onto the liner layer so as to fill the via opening. The first metal layer includes copper, tungsten, aluminum, alloys thereof, or mixtures. An overburden of the first metal layer is removed from the liner layer on the second interlayer dielectric by a first planarizing process. The first planarizing process is continued to form a recess in the via opening without removing the liner layer. A second metal layer different from the first metal layer is deposited so as to fill the recess with the second metal layer to form the via structure and provide an overburden of the second metal layer on the second interlayer dielectric. The second metal includes tantalum, titanium, tungsten, cobalt, ruthenium, iridium, rhodium, nitrides thereof, alloys thereof, or mixtures thereof. A third metal layer is deposited onto the second metal layer. The second and third metal layers are patterned to form a column of the second and third metal layers overlying the via structure of the second interconnect structure. An interlayer dielectric is deposited onto the second interconnect structure to form a third interconnect structure on the second interconnect structure, wherein the second metal in the column defines a bottom electrode.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
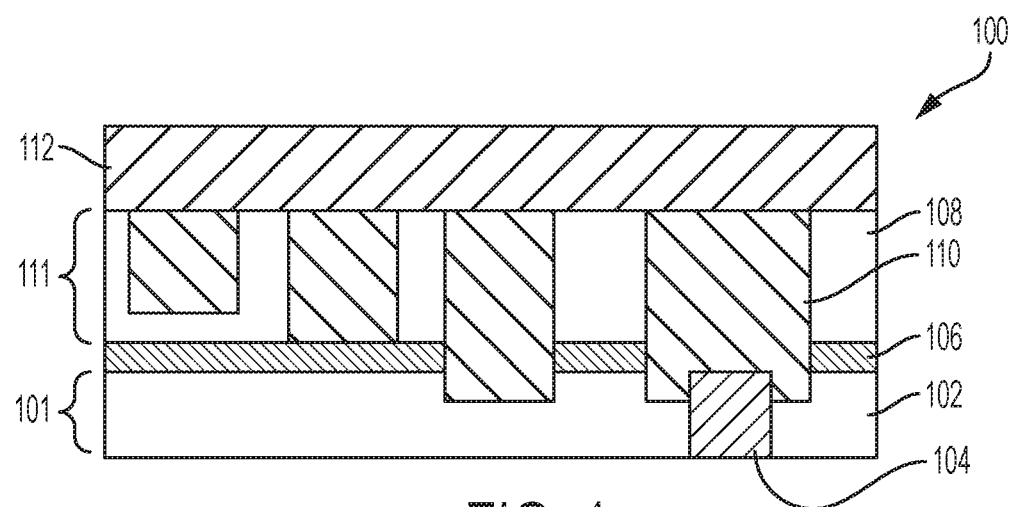
FIG. 1 depicts a cross section of an initial structure for forming a second interconnect structure subsequent to deposition of an interlayer dielectric onto a first interconnect structure in accordance with one or more embodiments of the present invention.

The present invention generally relates to a BEOL metallization structures and processes that include a recessed via structure in an interlayer dielectric of an interconnect structure and processes for forming conductive connections between layers with the recessed via structure of the interconnect structure. Prior via structures formed during BEOL metallization processing were not recessed and when underlying another interconnect structure including a bottom electrode for MRAM devices, for example, are typically filled with tantalum nitride or titanium nitride using a plasma vapor deposition process or a chemical vapor deposition process. However, as devices scale to ever decreasing dimensions, voids are often formed during the plasma vapor deposition process of these materials when filling the via opening. In contrast, it is generally easier to fill a via opening with an electroplated metal such as copper, for example. However, reliability concerns are introduced because metals such as copper are susceptible to electromigration. In aspects of the present invention, a metal such as copper fills the via opening and is recessed. The recess is subsequently filled with a second metal that provides barrier properties so as to minimize any reliability concerns with the use of copper, thereby providing a robust process and via structure for forming conductive connections between interconnect structures. The metal filling the recess of the via structure can be limited to the interconnect layer including the via structure or can fill the recess in the via structure and extend into the overlying interconnect structure so as to form a bottom electrode.

Detailed embodiments of an integrated circuit including at least one BEOL metallization structure including a recessed via structure as described above and methods for fabricating the integrated circuit including the at least one BEOL metallization structure according to aspects of the present invention will now be described herein. Advantageously, the BEOL recessed via structure can be utilized to provide a planar upper surface of a bottom electrode of an overlying layer such as can be desired for magnetoresistive random access memory (MRAM) devices or can be utilized to for providing a conductive pathway to a metal line while providing an effective barrier for the recessed via structure. The metal provided in the recess of the recessed via structure can be a tantalum, tungsten, titanium, cobalt, ruthenium, iridium, platinum, nitrides thereof, alloys thereof, which are known to function as an effective barrier for preventing copper electromigration, for example, thereby increasing device reliability.

It is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Turning now to FIGS. 1-11, schematically illustrated is a process flow for forming an integrated circuit including at least one interconnect structure having a recessed copper metal via structure according to one or more embodiments of the invention. The recessed copper metal via structure can be used to provide conductive pathways to underlying and overlying interconnect structures (e.g., lines), or to bottom electrodes for metal stacks and/or memory stacks.

In FIG. 1, there is shown a portion of an integrated circuit 100 including an exemplary lower interconnect structure 101, which can be used to provide conductive pathways to one or more devices (not shown) formed during FEOL processing. The lower interconnect structure 101 includes an interlayer dielectric 102 and at least one metal filled via 104 extending through the interlayer dielectric 102. The interlayer dielectric 102 can be any low k (i.e., k value less than 3.9) or oxide dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric 102 can be deposited by PECVD procedures as is generally known in the art.

The via 104 can be filled with copper, aluminum, tungsten, alloys thereof, combinations thereof, or the like. The lower interconnect structure 101 includes top and bottom planar surfaces.

Overlying the interconnect structure 102 is a hardmask layer 106. The hardmask layer 106 can be, for example, a single layer or a multilayer stack including one or more dielectric materials, such as SiC, SiN, SiC(N,H) or the like. The hardmask layer 106 can be deposited by PECVD procedures as is generally known in the art.

A second interconnect structure 111 is provided on the hardmask layer 106. The second interconnect structure 111 includes an interlayer dielectric 108 and one or more trench openings filled with a metal to define one or more metal lines 110. The metal lines 110 can be formed of copper, aluminum, tungsten, alloys thereof, combinations thereof, or the like. At least one of the metal lines can be coupled to via structure 104 as shown. The second interconnect structure 111 also includes top and bottom planar surfaces.

Figure 2:
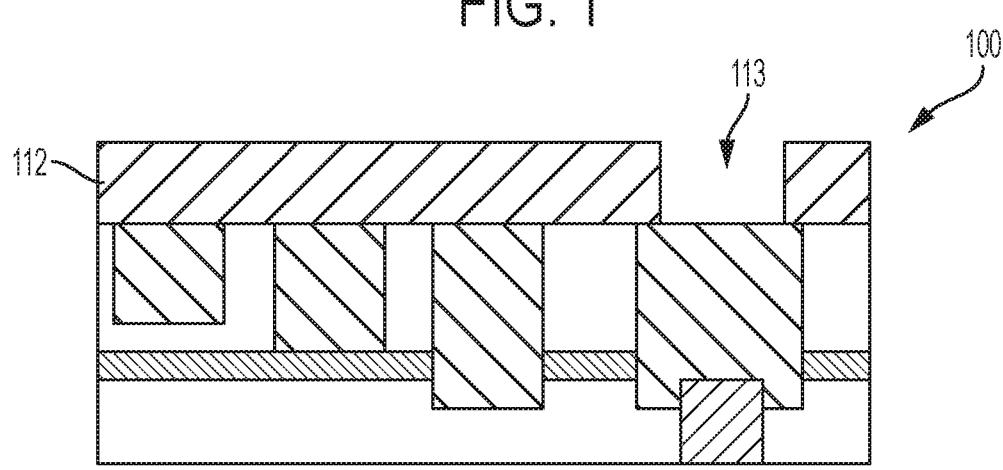
FIG. 2 depicts a cross section of the structure of FIG. 2 subsequent to patterning the interlayer dielectric to form a via opening in accordance with one or more embodiments of the present invention.

An interlayer dielectric layer 112 is provided on the second insulator 111. The interlayer dielectric 112 is lithographically patterned and etched to form one or more via openings 113 as shown in FIG. 2. The lithographic process for forming the one or more openings in the interlayer dielectric 112 can include deposition of a trilayer (not shown) including an organic planarizing layer, a silicon antireflective coating layer and a photoresist onto the surface of a hardmask layer (not shown). The photoresist is sensitive to radiation, e.g., extreme ultraviolet (EUV) radiation, and, depending on the photoresist used, portions of the photoresist that are exposed to the radiation can be removed (or left remaining) by a development process. The one or more via openings 113 are then formed in the interlayer dielectric 112 by etching or otherwise modifying the interlayer dielectric 112 in the areas from which the photoresist has been removed. For example, a reactive ion etch process can be used to anisotropically remove portions of the interlayer dielectric layer 112 to form the one or more via openings 113.

Figure 3:
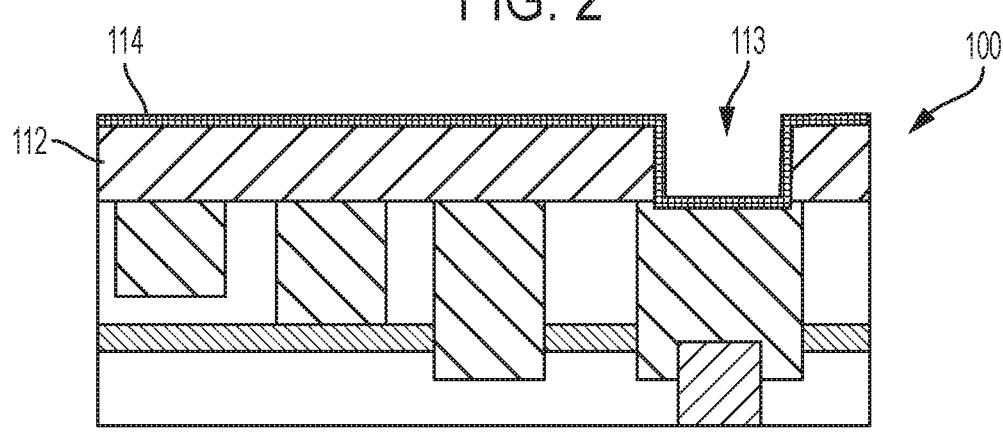
FIG. 3 depicts a cross section of the structure of FIG. 2 subsequent to subsequent to deposition of a liner layer on to the patterned interlayer dielectric in accordance with one or more embodiments of the present invention.

As shown in FIG. 3, a liner layer 114 (i.e., diffusion barrier layer) is conformally deposited onto the patterned interlayer dielectric 112. For example, tantalum, tantalum nitride, cobalt, ruthenium, titanium, titanium nitride, tungsten nitride, and combinations of more than one material (for example tantalum nitride/tantalum or tantalum nitride/cobalt). The presence of the liner layer such as titanium nitride, for example, insures that subsequent deposition of a metal such as copper to fill the opening 113, which can participate in interdiffusion during subsequent annealing processes, will not further diffuse into interlayer dielectric 112. The liner layer 114 can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Figure 4:
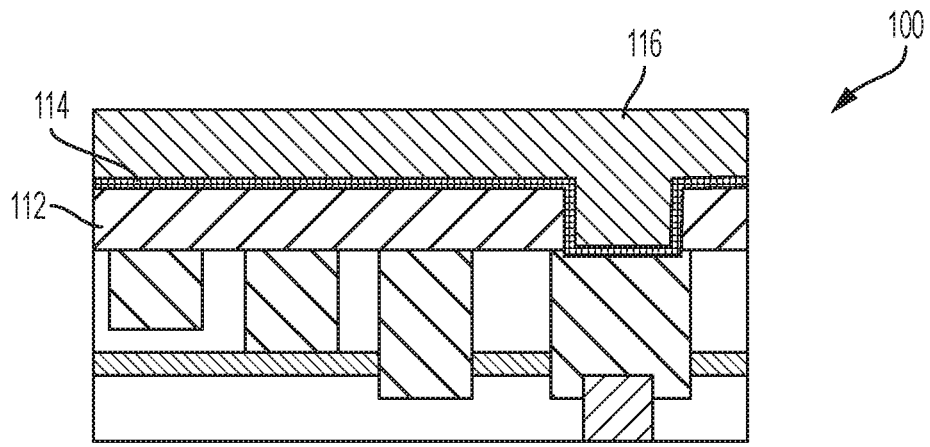
FIG. 4 depicts a cross section of the structure of FIG. 3 subsequent to deposition of a first metal layer in accordance with one or more embodiments of the present invention.

Following deposition of the seed layer, a layer of metal 116 is then deposited as shown in FIG. 4. The metal can be copper, but can be any suitable conductor including, but not limited to copper, aluminum, tungsten, alloys thereof, and mixtures thereof. In some structures, copper metal layer can be used to fill the via openings 113 and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal layer 116 can be formed by CVD, sputtering, electrochemical deposition or like processes. For example, the deposition of copper can proceed by electrochemical deposition such as electroplating or electroless plating as is known in the art.

Figure 5:
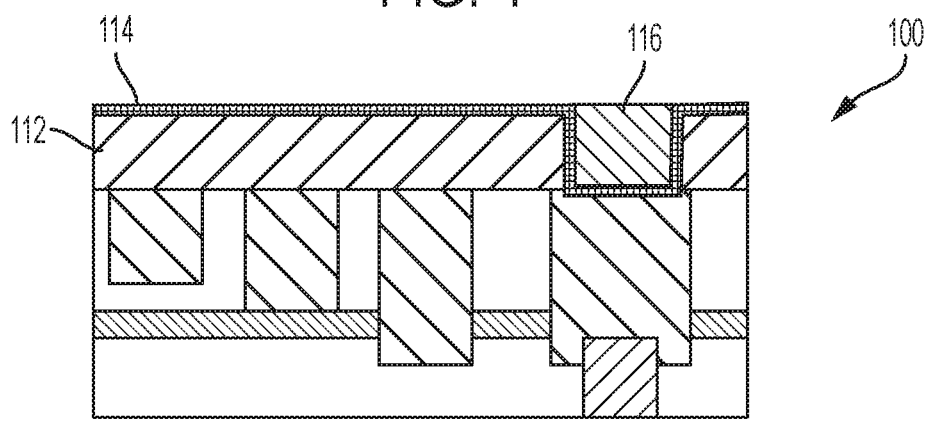
FIG. 5 depicts a cross section of the structure of FIG. 4 subsequent to planarization to remove an overburden of the metal layer in accordance with one or more embodiments of the present invention.

Turning now to FIG. 5, following formation of the metal layer 116, the substrate is subjected to a planarization process to remove any metal overburden such that a top surface of the metal 116 in the via opening 113 is substantially coplanar to the liner layer 116 as shown. The planarization process does not remove the liner layer 114 on interlayer dielectric 112. By way of example, the surface can be planarized using an electropolishing process. In an electropolishing process, small amounts of metal are etched by electroetch or electrochemical etching to provide a metal interconnect having a top metal surface generally coplanar to the top surface of the dielectric. Such a structure is often referred to as a recessed structure. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

Figure 6:
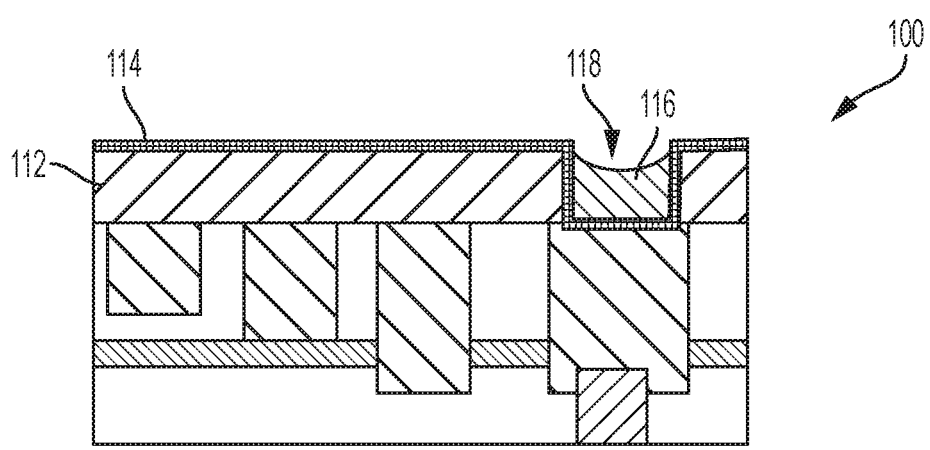
FIG. 6 depicts a cross section of the structure of FIG. 5 subsequent to continued planarization to form a recess in the via structure in accordance with one or more embodiments of the present invention.

In FIG. 6, the planarization process is continued so as to form a recess 118 in the metal 116. The liner layer 114 remains and protects the interlayer dielectric 112.

Figure 7:
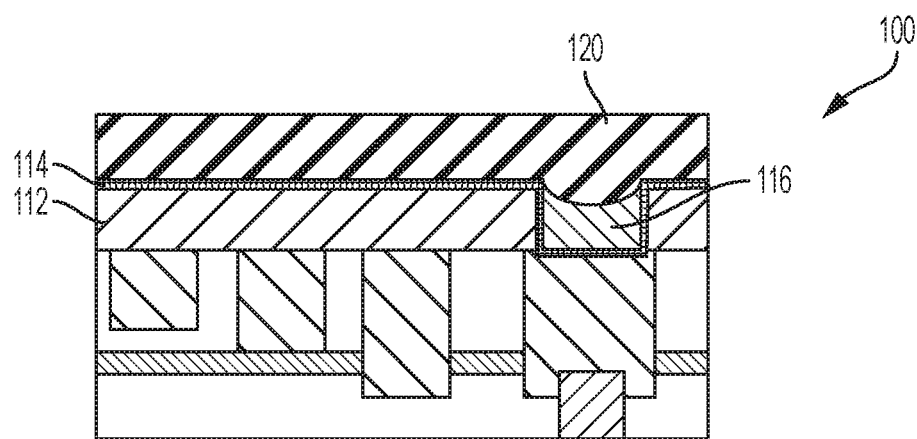
FIG. 7 depicts a cross section of the structure of FIG. 6 subsequent to deposition of a second metal layer in accordance with one or more embodiments of the present invention.

In FIG. 7, a layer 120 is deposited onto the structure and fills the recess 118. The layer can be tantalum, titanium, tungsten, cobalt, ruthenium, iridium, rhodium, nitrides thereof, alloys thereof, and the like. These materials are conductive yet form an effective barrier for the underlying metal filled via, e.g., a copper filled via. The metal filling the recess 118 is selected to be different from the metal filling the via and provide barrier properties Referring now to FIG. 8, a planarization process is used to remove the overburden of layer 120 and the liner layer 114 on the dielectric layer 112. Layer 120 fills the recess 118 of the via structure and is coplanar with the interlayer dielectric 112. The metal filled recessed via structure provided in the interlayer dielectric 112 defines the third interconnect structure 121.

Figure 8:
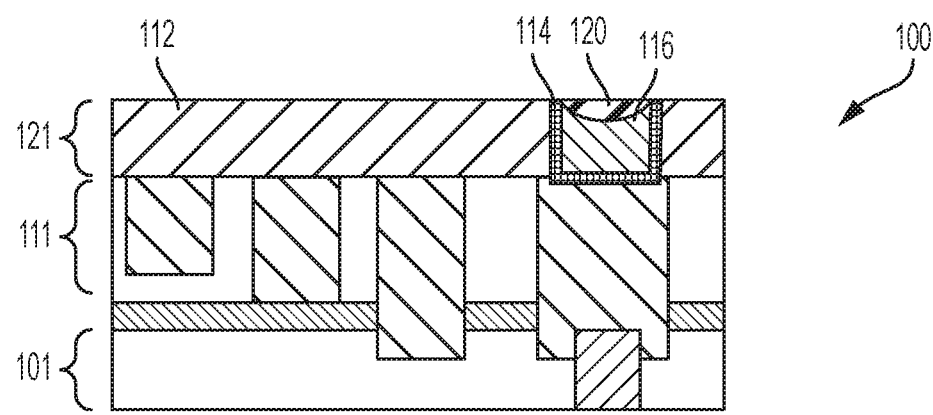
FIG. 8 depicts a cross section of the structure of FIG. 7 subsequent to planarization to remove an overburden of the second metal and to define the second interconnect structure in accordance with one or more embodiments of the present invention.
Figure 9:
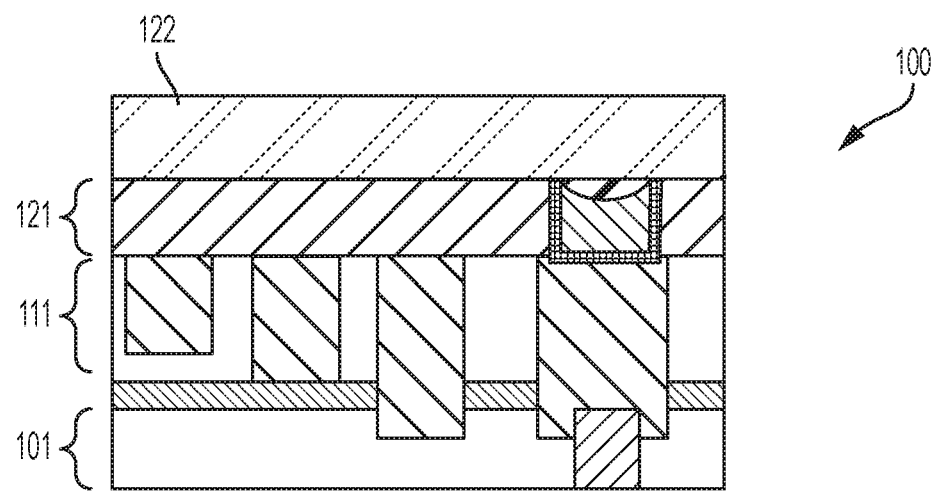
FIG. 9 depicts a cross section of the structure of FIG. 8 subsequent to deposition of an interlayer dielectric on the second interconnect structure in accordance with one or more embodiments of the present invention.

FIG. 9 illustrates the semiconductor structure 100 of FIG. 8 subsequent to deposition of an interlayer dielectric 122 onto the third interconnect structure. The interlayer dielectric 122 can be any low k (i.e., k value less than 3.9) or oxide dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric 122 can be deposited by PECVD procedures as is generally known in the art.

Figure 10:
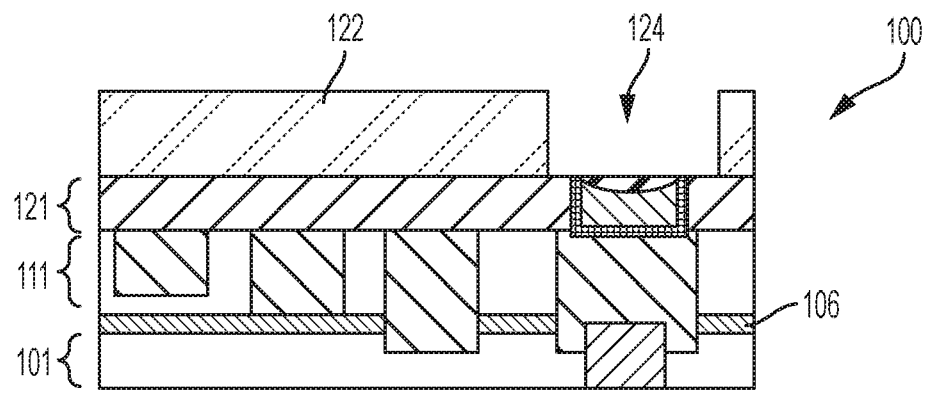
FIG. 10 depicts a cross section of the structure of FIG. 9 subsequent to patterning the interlayer dielectric to form trench openings on the second interconnect structure accordance with one or more embodiments of the present invention.

FIG. 10 illustrates the semiconductor structure 100 of FIG. 9 subsequent to lithographic patterning of an interlayer dielectric 122 to form at least one trench opening 124 to the underlying recessed via structure.

Figure 11:
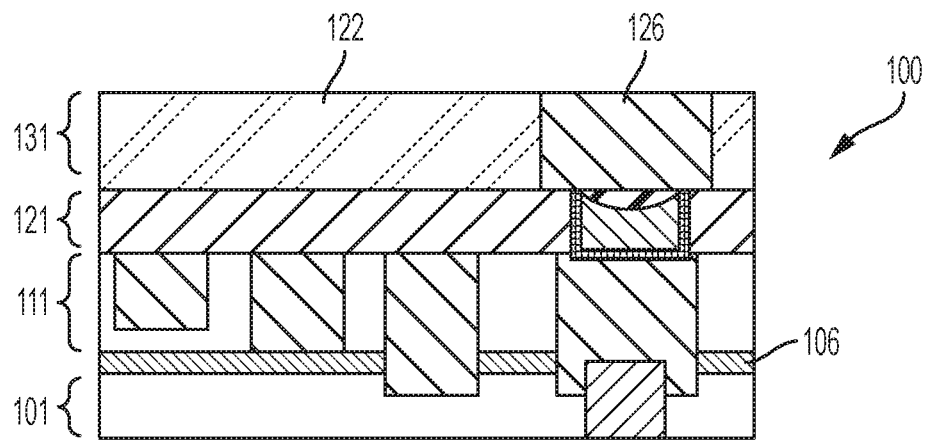
FIG. 11 depicts a cross section of the structure of FIG. 10 subsequent to filling the trench opening in the interlayer dielectric with a metal in accordance with one or more embodiments of the present invention.

FIG. 11 illustrates the semiconductor structure 100 of FIG. 10 subsequent to metallization and planarization to form metal filled trenches 126, (i.e., lines) so as to define the fourth interconnect structure 13, which is electrically coupled to the underlying metal filled recessed via structure. In addition to interconnect lines, the metallization process can also be used to form metal stacks, and/or memory stacks.

Figure 12:
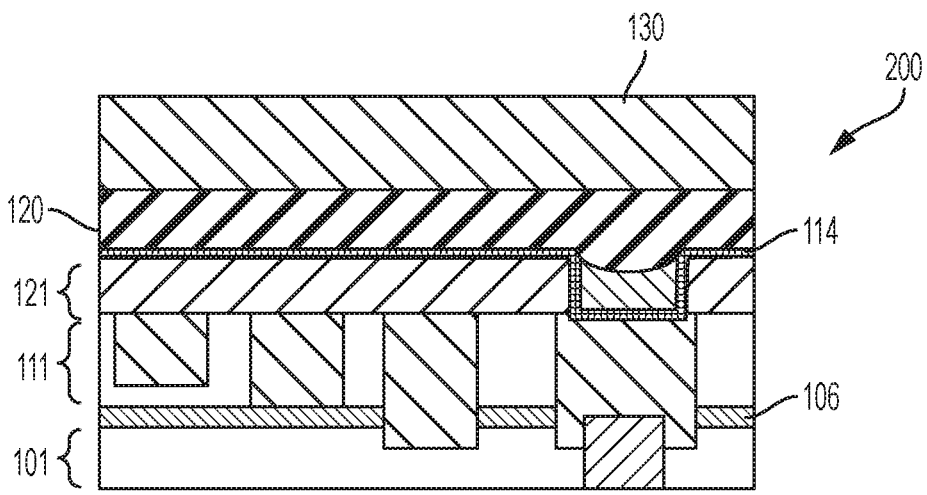
FIG. 12 depicts a cross section of the structure of FIG. 4 subsequent to deposition of a third metal layer on the second metal layer in accordance with one or more embodiments of the present invention.

FIG. 12 illustrates the semiconductor structure 200 including the intermediary structure shown in FIG. 4 subsequent to deposition of a layer 130 onto metal layer 120 in accordance with one or more embodiments. Layer 130 can be formed of a single metal such as copper, tungsten, aluminum, or alloys thereof or combinations thereof so as to define an interconnect line or multiple metal layers to define a metal stack, e.g., alternating conductive metals and insulator layers or a memory stack, e.g., magnetic tunnel junction structure with alternating magnetic layers and insulator layers.

Figure 13:
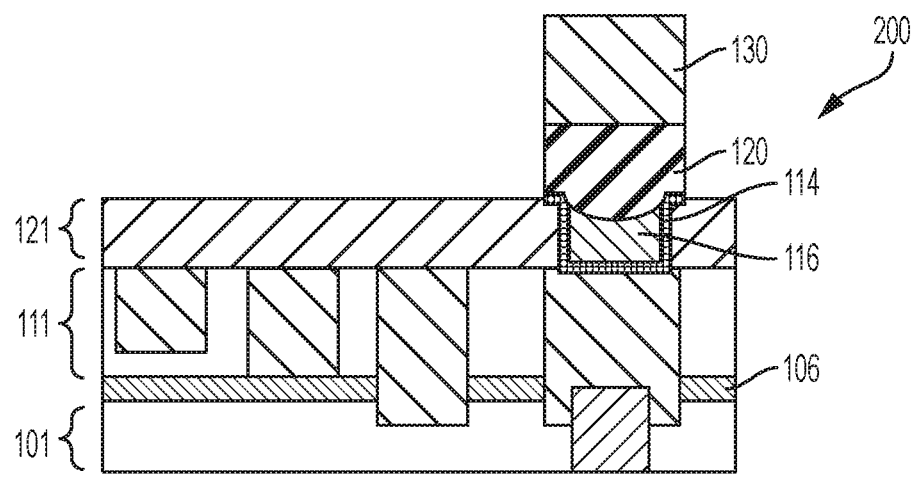
FIG. 13 depicts a cross section of the structure of FIG. 12 subsequent to patterning the second and third metal layer to form a column overlying the via structure of the second interconnect structure in accordance with one or more embodiments of the present invention.

FIG. 13 illustrates the semiconductor structure 200 of FIG. 12 subsequent to patterning of layer 130 and metal layer 120. Patterning can be effected by chemical and/or physical bombardment processes specific for removing the materials defining layers 120 and 130 using a hardmask. For example, a reactive ion etch process can be used. In the case of layer 130 being formed of multiple layers, the resulting structure can be used to provide a metal stack or memory stack formed on a planar upper surface of a bottom electrode formed from patterning layer 120. The bottom electrode fills the recessed via structure so as to provide effective contact to the via and provide a barrier for the metal filled via structure. As shown, the liner layer 114 and the metal 120 encapsulate the metal filled recessed via structure.

Figure 14:
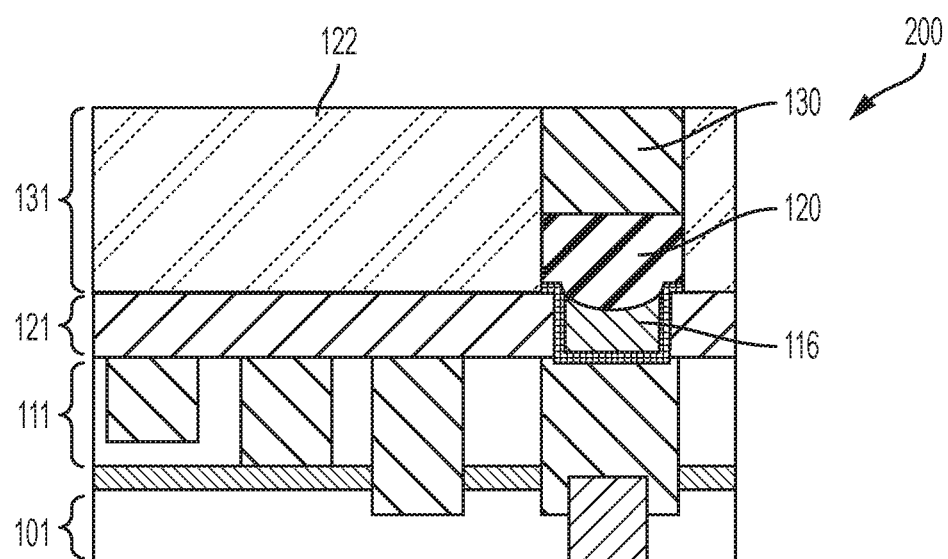
FIG. 14 depicts a cross section of the structure of FIG. 13 subsequent to deposition of an interlayer dielectric on the second interconnect structure to form a third interconnect structure in accordance with one or more embodiments of the present invention.

FIG. 14 illustrates the semiconductor structure 200 of FIG. 13 subsequent to deposition of an interlayer dielectric 132 and planarization such that uppermost surface of the interlayer dielectric 132 is coplanar to the uppermost surface of layer 130, thereby forming the fourth interconnect structure 131.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A back end of line (BEOL) metallization fabrication method comprising:

forming a second interconnect structure including a via structure by depositing a second interlayer dielectric onto a planar top surface of a first interconnect structure;

patterning the second interlayer dielectric to form a via opening and expose a surface of the first interconnect structure;

conformally depositing a liner layer onto the second interlayer dielectric;

depositing a first metal layer onto the liner layer so as to fill the via opening, the first metal layer comprising copper, tungsten, aluminum, alloys thereof, or mixtures thereof;

removing an overburden of the first metal layer from the liner layer on the second interlayer dielectric by a first planarizing process;

continuing the first planarizing process to form a recess in the via opening without removing the liner layer;

depositing a second metal layer different from the first metal layer so as to fill the recess with the second metal layer to form the via structure and provide an overburden of the second metal layer on the second interlayer dielectric, wherein the second metal comprises tantalum, titanium, tungsten, cobalt, ruthenium, iridium, rhodium, nitrides thereof, alloys thereof, or mixtures thereof;

depositing a third metal layer onto the second metal layer;

patterning the second and third metal layers to form a column of the second and third metal layers overlying the via structure of the second interconnect structure; and depositing a third interlayer dielectric onto the second interconnect structure to form a third interconnect structure on the second interconnect structure, wherein the second metal in the column defines a bottom electrode.

2. The BEOL metallization method of claim 1, wherein the second metal fills the recess in the via structure of the second interconnect structure.

3. The BEOL metallization method of claim 1, wherein depositing the third metal layer onto the second metal layer further comprises alternatingly depositing insulating layers, wherein patterning the second and third metal layers to form the column defines a memory stack.

4. The BEOL metallization method of claim 1, wherein depositing the third metal layer onto the second metal layer further comprises alternatingly depositing metal magnetic layers and insulating layers, wherein patterning the second and third metal layers to form the column defines an MRAM device.

5. The BEOL metallization method of claim 1, wherein depositing the first metal layer comprises an electroplating process.

6. The BEOL metallization method of claim 1, wherein subsequent to depositing the second metal layer and prior to depositing the third metal layer the method further comprises planarizing the substrate to remove the overburden of the second metal and the exposed liner layer.

7. The BEOL metallization method of claim 1, wherein patterned third metal layer comprises copper, tungsten, aluminum, or alloys.

8. The BEOL metallization method of claim 1, wherein the patterned third metal layer defines an interconnect line.

9. The BEOL metallization method of claim 1, wherein subsequent to depositing the interlayer dielectric onto the second interconnect structure further comprising planarizing such that an uppermost surface of the interlayer dielectric is coplanar to the uppermost surface of the third metal layer.

* * * * *